(12) United States Patent  
Juang et al.

(10) Patent No.: US 10,825,988 B2  
(45) Date of Patent: Nov. 3, 2020

(54) LIGHT-EMITTING MATERIAL AND DISPLAY APPARATUS

(71) Applicant: Chi Mei Corporation, Tainan (TW)

(72) Inventors: Yuan-Ren Juang, Tainan (TW); Szu-Chun Yu, Tainan (TW); Jen-Shrong Uen, Tainan (TW)

(73) Assignee: Chi Mei Corporation, Tainan (TW)

( * ) Notice: Subject to any disclaimer, the term of this patent is extended or adjusted under 35 U.S.C. 154(b) by 0 days.

(21) Appl. No.: 15/931,616

(22) Filed: May 14, 2020

(65) Prior Publication Data

US 2020/0280000 A1 Sep. 3, 2020

Related U.S. Application Data

(63) Continuation of application No. 15/615,843, filed on Jun. 7, 2017, now abandoned.

(30) Foreign Application Priority Data

Jun. 8, 2016 (TW) .............................. 105118241 A

(51) Int. Cl.

| | |
|---|---|
| H01L 51/00 | (2006.01) |
| H01L 51/50 | (2006.01) |
| C09K 11/06 | (2006.01) |
| H01L 27/15 | (2006.01) |
| H01L 33/18 | (2010.01) |
| H01L 33/34 | (2010.01) |
| H01L 33/14 | (2010.01) |
| H01L 33/50 | (2010.01) |

(52) U.S. Cl.
CPC .......... *H01L 51/0001* (2013.01); *C09K 11/06* (2013.01); *H01L 27/15* (2013.01); *H01L 33/145* (2013.01); *H01L 33/18* (2013.01); *H01L 33/346* (2013.01); *H01L 51/005* (2013.01); *H01L 51/0081* (2013.01); *H01L 51/502* (2013.01); *H01L 33/502* (2013.01)

(58) Field of Classification Search
None
See application file for complete search history.

(56) References Cited

U.S. PATENT DOCUMENTS

| | | | | |
|---|---|---|---|---|
| 2008/0095852 | A1* | 4/2008 | Kong | .................... C01B 33/142 424/489 |
| 2016/0084476 | A1* | 3/2016 | Koole | ....................... F21V 9/32 362/84 |
| 2018/0122869 | A1* | 5/2018 | Jiang | .................... H01L 27/3211 |
| 2018/0351125 | A1* | 12/2018 | He | ...................... H01L 51/0003 |

* cited by examiner

*Primary Examiner* — Steven M Christopher

(74) *Attorney, Agent, or Firm* — JCIPRNET

(57) ABSTRACT

A light-emitting material, a method for producing the light-emitting material and a display apparatus are provided. An average particle size of the light-emitting material is 0.1 μm to 30 μm, and an average distance between outermost quantum dots of a particle of the light-emitting material and a surface of the particle of the light-emitting material is 0.5 nm to 25 nm, or a minimum distance between the outermost quantum dots of a particle of the light-emitting material and the surface of the particle of the light-emitting material is 0.1 nm to 20 nm.

14 Claims, 7 Drawing Sheets

LIGHT-EMITTING MATERIAL AND DISPLAY APPARATUS

CROSS-REFERENCE TO RELATED APPLICATION

This is a continuation application of and claims the priority benefit of U.S. patent application Ser. No. 15/615,843, filed on Jun. 7, 2017, now pending, which claims the priority benefit of Taiwan application serial no. 105118241, filed on Jun. 8, 2016. The entirety of each of the above-mentioned patent applications is hereby incorporated by reference herein and made a part of this specification.

BACKGROUND OF THE INVENTION

Field of the Invention

The invention relates to a light-emitting material, a method for producing the light-emitting material and a display apparatus, and particularly relates to a light-emitting material having quantum dots, a method for producing the light-emitting material and a display apparatus.

Description of Related Art

Quantum dot is a material with good light absorption and luminescence properties, which has narrow light-emitting full width at half maximum (FWHM), high light-emitting efficiency and a wider absorption spectrum, so that it has high color purity and saturation, and is gradually applied to display panel techniques in recent years. Presently, when the quantum dots are applied, the quantum dots are directly dispersed in a solvent, and then coated on a desired position. However, the light-emitting feature of the quantum dot has considerable relevance with a size thereof. Not only the quantum dots are hard to be evenly distributed in the solvent, but also the quantum dots are probably gathered into micron-sized quantum dot clusters. In this case, light-emitting uniformity is not easy to be improved, and the micron-sized quantum dot clusters may loss the light-emitting feature. On the other hand, the quantum dots preserved in a liquid form have high difficulty in application, and are not easy to be applied in various different processing designs. Moreover, the periphery of the quantum dots and polymers such as ligands thereof have disadvantages of none high-temperature endurance, which also limits the application of the quantum dots. Therefore, how to produce a quantum dot material with a long service life becomes an important issue in application and promotion of the quantum dots.

SUMMARY OF THE INVENTION

The invention is directed to a light-emitting material, a method for producing the light-emitting material and a display apparatus, which are adapted to resolve a problem of poor light-emitting efficiency of quantum dots.

The invention provides a light-emitting material with an average particle size of 0.1 μm to 30 μm, where a minimum distance between outermost quantum dots of a particle of the light-emitting material and a surface of the particle of the light-emitting material is 0.1 nm to 20 nm.

The invention provides another light-emitting material with an average particle size of 0.1 μm to 30 μm, where an average distance between outermost quantum dots of a particle of the light-emitting material and a surface of the particle of the light-emitting material is 0.5 nm to 25 nm.

In an embodiment of the invention, the quantum dots are selected from the group consisting of silicon based nanocrystals, perovskite nanocrystals, II-VI group compound semiconductor nanocrystals, III-V group compound semiconductor nanocrystals and IV-VI group compound semiconductor nanocrystals.

In an embodiment of the invention, an average particle size of the quantum dots is 1 nm to 25 nm.

In an embodiment of the invention, the quantum dots include red light quantum dots, green light quantum dots and blue light quantum dots, where an average particle size of the red light quantum dots is 3 nm to 25 nm, an average particle size of the green light quantum dots is 2 nm to 20 nm, and an average particle size of the blue light quantum dots is 1 nm to 15 nm.

In an embodiment of the invention, under irradiation of a light with a wavelength of 390 nm to 500 nm, the red light quantum dots emit a light with a peak wavelength of 610 nm to 660 nm and a peak full width at half maximum (FWHM) of 15 nm to 60 nm, the green light quantum dots emit a light with a peak wavelength of 520 nm to 550 nm and a peak FWHM of 15 nm to 60 nm, and the blue light quantum dots emit a light with a peak wavelength of 440 nm to 460 nm and a peak FWHM of 15 nm to 60 nm.

In an embodiment of the invention, under irradiation of a light with a wavelength of 390 nm to 500 nm, the quantum dots emit a light with a peak wavelength of 400 nm to 700 nm and a peak FWHM of 15 nm to 60 nm.

In an embodiment of the invention, a weight percentage of the quantum dots is 0.1% to 30%.

In an embodiment of the invention, the particle includes a core, a package layer and the quantum dots. The package layer wraps the core, and the quantum dots are disposed between the core and the package layer.

In an embodiment of the invention, a material of the core is porous.

In an embodiment of the invention, a surface mean aperture of the core is 3 nm to 100 nm.

In an embodiment of the invention, when the quantum dots are the red light quantum dots, the surface mean aperture of the core is 7 nm to 30 nm, when the quantum dots are the green light quantum dots, the surface mean aperture of the core is 5 nm to 20 nm, and when the quantum dots are the blue light quantum dots, the surface mean aperture of the core is 3 nm to 15 nm.

In an embodiment of the invention, a specific surface area of the core is 100 m$^2$/g to 1000 m$^2$/g.

In an embodiment of the invention, a material of the core is selected from the group consisting of polysiloxane, glass, water glass and silicon dioxide.

In an embodiment of the invention, a material of the package layer is selected from the group consisting of polysiloxane, glass, water glass and silicon dioxide.

In an embodiment of the invention, a thickness of the package layer is 0.1 nm to 20 nm.

In an embodiment of the invention, an average particle size of the core is 0.1 μm to 25 μm.

In an embodiment of the invention, the core has lipophilicity.

The invention provides a method for producing a light-emitting material, which includes following steps. A core attached with quantum dots is produced. The core attached with the quantum dots and a package material are mixed to produce the light-emitting material. A particle of the light-emitting material includes the core, the quantum dots and a package layer, where the package layer is composed of the package material and wraps the core, and the quantum dots are disposed between the core and the package layer.

In an embodiment of the invention, the step of producing the core attached with the quantum dots includes producing the core with an average particle size of 0.1 μm to 25 μm and attached with the quantum dots.

In an embodiment of the invention, the step of producing the core attached with the quantum dots includes mixing a quantum dot solution with the core, where the quantum dot solution is formed by mixing the quantum dots with n-hexane.

In an embodiment of the invention, a weight percentage of the quantum dots of the quantum dot solution is 0.1% to 5%.

In an embodiment of the invention, the step of producing the core attached with the quantum dots includes mixing the quantum dots with a core solution, where the core solution is formed by mixing the core with n-hexane.

In an embodiment of the invention, a weight percentage of the core of the core solution is 0.5% to 10%.

In an embodiment of the invention, the step of producing the core attached with the quantum dots includes centrifugal filtration after standing.

In an embodiment of the invention, the package layer is obtained through the reaction of silicon oxide.

The invention provides a display apparatus including the aforementioned light-emitting material, and the display apparatus is a television, a digital camera, a digital video camera, a digital photo frame, a mobile phone, a notebook computer, a monitor for a computer, an audio reproduction device, a game machine or a vehicle display.

According to the above description, in the light-emitting material, the method for producing the light-emitting material and the display apparatus, the quantum dots are located in internal of the light-emitting material and the light-emitting material presents a granular state, so that during the application, the quantum dots are unnecessary to be distributed in the solvent and are not gathered to lose the light-emitting feature, such that good light-emitting efficiency is achieved.

In order to make the aforementioned features and advantages of the invention comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
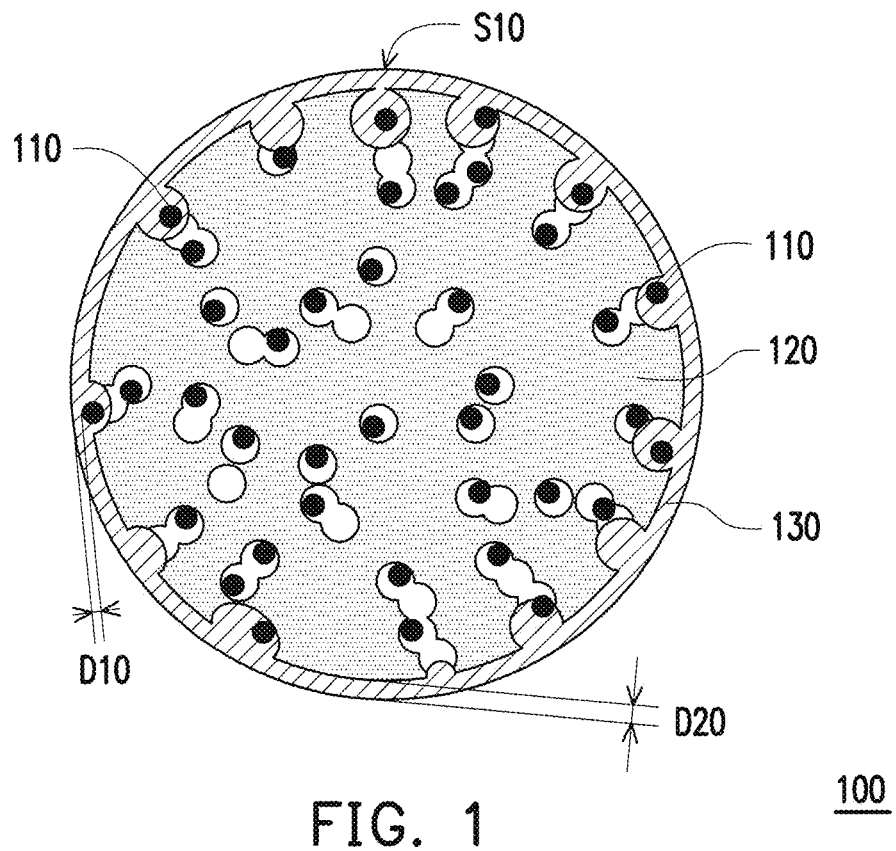
FIG. 1 is a cross-sectional view of a light-emitting material according to an embodiment of the invention.

FIG. 1 is a cross-sectional view of a light-emitting material according to an embodiment of the invention. Referring to FIG. 1, an average particle size of the light-emitting material 100 of the present embodiment is 0.1 μm to 30 μm, or 0.5 μm to 25 μm, or 0.5 μm to 20 μm. From a macro point of view, the light-emitting material 100 of the present embodiment presents a granular state, and a size of each particle is probably different, though the particle size of the light-emitting material of the present embodiment is 0.1 μm to 30 μm, or within the aforementioned ranges. The average particle size of the light-emitting material 100 is an average of the particle sizes of at least 20 particles in the light-emitting material 100. Regarding a distance between outermost quantum dots 110 of the particle of the light-emitting material 100 and a surface S10 of the particle of the light-emitting material 100, two aspects are provided for description, and there is no interdependence between the two aspects, and any light-emitting material complying with any one of the two aspects is considered to be the light-emitting material suitable for the invention.

One of the aspects is to discuss a minimum distance D10 between the outermost quantum dots 110 of the particle of the light-emitting material 100 and the surface S10 of the particle of the light-emitting material 100, and a range of the minimum distance D10 is 0.1 nm to 20 nm, i.e. the minimum distance D10 between the quantum dots 110 located the closest to the particle surface in the particle and the particle surface S10 of the light-emitting material 100 is 0.1 nm to 20 nm, or 0.1 nm to 15 nm, or 0.1 nm to 10 nm.

The other aspect is to discuss an average distance between the outermost quantum dots 110 of the particle of the light-emitting material 100 and the surface S10 of the particle of the light-emitting material 100, and a range of the average distance is 0.5 nm to 25 nm, or 0.5 nm to 18 nm, or 0.5 nm to 12 nm. The calculation method of the average distance is, for example, to adopt at least three particles in the light-emitting material 100 to obtain the minimum distance D10 between the outermost quantum dot 110 of each of the three particles and the surface S10 of the particle, and take an average of the at least three minimum distances D10 as the average distance.

Since the particle size of the light-emitting material 100 of the present embodiment is 0.1 μm to 30 μm, which is greater than the nanometre-level size of the quantum dot itself, the light-emitting material 100 can be used in form of a solid state, or can be added into a solvent and used in form of a liquid state, and uniformity of distribution of the light-emitting material 100 with the particle size of 0.1 μm to 30 μm can be easily controlled in usage. The particle size of the light-emitting material 100 can be observed and measured by using a transmission electron microscopy. Moreover, since the minimum distance D10 between the outermost quantum dots 110 of the light-emitting material 100 and the surface S10 of the particle of the light-emitting material 100 is 0.1 nm to 20 nm, or the average distance between the outermost quantum dots 110 of the light-emitting material 100 and the surface S10 of the particle of the light-emitting material 100 is 0.5 nm to 25 nm, the quantum dots 110 can be properly protected, and when the light-emitting material 100 is applied to a light-emitting diode (LED) package or other products, the quantum dots 110 embedded in the light-emitting material 100 can be properly protected, and may resist a chemical reaction and high temperature, high humidity in a processing process, such that reliability of a final product is improved and better light-emitting efficiency is maintained. If the quantum dots 110 are excessively close to the surface S10 in the light-emitting material 100, the quantum dots 110 probably cannot be sufficiently protected, and the final light-emitting efficiency is influenced by a process environment. If the quantum dots 110 are located excessively away from the surface S10 in the light-emitting material 100, it may have a problem of insufficient overall light-emitting efficiency. Moreover, through the porous cores, so that there is appropriate distances between the quantum dots 110, and avoid excessive close distances between the quantum dots 110 to lose the light-emitting feature.

The quantum dots 110 of the present embodiment are, for example, selected from the group consisting of silicon based nanocrystals, perovskite nanocrystals, II-VI group compound semiconductor nanocrystals, III-V group compound semiconductor nanocrystals and IV-VI group compound semiconductor nanocrystals, though the invention is not limited thereto.

One of implementations of the aforementioned perovskite nanocrystal is organic metal halide $RNH_3PbX_3$ or pure inorganic perovskite $CsPbX_3$, where R can be $C_nH_{2n+1}$, n has a range of 1-10, and X is selected from the group consisting of chlorine, bromine and iodine or a mixture thereof; for example, selected from the group consisting of $CH_3NH_3PbI_3$, $CH_3NH_3PbCl_3$, $CH_3NH_3PbBr_3$, $CH_3NH_3PbI_2Cl$, $CH_3NH_3PbICl_2$, $CH_3NH_3PbI_2Br$, $CH_3NH_3PbIClBr$, $CH_3NH_3PbIBr_2$, $CH_3NH_3PbICIBr$, $CsPbI_3$, $CsPbCl_3$, $CsPbBr_3$, $CsPbI_2Cl$, $CsPbICl_2$, $CsPbI_2Br$, $CsPbIBr_2$ and $CsPbIClBr$, though the invention is not limited thereto.

One of implementations of the aforementioned II-VI group compound semiconductor nanocrystal is II-VI, where II is selected from the group consisting of zinc, cadmium and mercury or a mixture thereof, VI is selected from the group consisting of oxygen, sulfur, selenium, tellurium or a mixture thereof; for example, selected from the group consisting of CdO, CdS, CdSe, CdTe, ZnO, ZnS, ZnSe, ZnTe, HgO, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, though the invention is not limited thereto. One of implementations of the aforementioned III-V group compound semiconductor nanocrystal is III-V, where III is selected from the group consisting of aluminium, gallium and indium or a mixture thereof, V is selected from the group consisting of nitrogen, phosphorus, arsenic or a mixture thereof; for example, selected from the group consisting of GaN, GaP, GaAs, AlN, AlP, AlAs, InN, InP, InAs, GaNP, GaNAs, GaPAs, AlNP, ANAs, AlPAs, InNP, InNAs, InPAs, GaAlNP, GaAlNAs, GaAlPAs, GaInNP, GaInNAs, GaInPAs, InAlNP, InAlNAs, InCuSe and InAlPAs, though the invention is not limited thereto. The aforementioned IV-VI group compound semiconductor nanocrystal is, for example, PbTe, though the invention is not limited thereto.

Moreover, those skilled in the art should understand that the quantum dots 110 of the nano-particle type can be divided into a binary core, a ternary core or a quaternary core structure. Alternatively, the quantum dots 110 of the nano-particle type can be a core-shell structure or a core-multishell structure. Alternatively, the quantum dots 110 of the nano-particle type can be doped or graded nano-particles. The quantum dots 110 of the present embodiment are preferably nano-particles of a CdSe/ZnS core/shell structure.

The inorganic surface atoms of the quantum dots 110 may implement surface reforming by using an organic group. The organic group avails suppressing gathering of the quantum dots, and may properly isolate the quantum dots 110 from their surrounding electronic and chemical environments. The organic group is generally referred to as a sealing agent.

In many cases, the sealing agent includes or is basically formed by a Lewis base compound, for example, a hydrocarbon Lewis base compound diluted in an inert solvent. The sealing agent includes mono-functional or multifunctional ligands, for example, phosphine (trioctylphosphine, triphenylphosphine, t-butylphosphine etc.), phosphine oxide (trioctylphosphine oxide, triphenylphosphine oxide, etc.), alkyl phosphonic acid, alkylamine (hexadecylamine, octylamine, etc.), arylamine, pyridine, long chain fatty acid, thiophene, etc.

A change of the average particle size of the quantum dots may cause a change of a wavelength of a light emitted by the quantum dots. Therefore, a peak wavelength of the light emitted by the quantum dots can be controlled by the material and the size of the quantum dots. The average particle size of the quantum dots 110 of the present embodiment is, for example, 1 nm to 25 nm, or 1 nm to 15 nm, or 1 nm to 10 nm. The quantum dots 110 of the present embodiment include red light quantum dots, green light quantum dots and blue light quantum dots. The red light quantum dots are configured to emit a red light, and an average particle size thereof is, for example, 3 nm to 25 nm, or 4 nm to 15 nm, or 5 nm to 10 nm. The green light quantum dots are configured to emit a green light, and an average particle size thereof is, for example, 2 nm to 20 nm, or 3 nm to 15 nm, or 4 nm to 9 nm. The blue light quantum dots are configured to emit a blue light, and an average particle size thereof is, for example, 1 nm to 15 nm, or 2 nm to 10 nm, or 2 nm to 8 nm.

A photoluminescence (PL) analysis may quickly and reliably measure an energy level structure and a transition behaviour in the material, which is a powerful and nondestructive analysis technique. By analyzing features of an excitation spectrum, a type of doped impurity, a band gap size, a compound composition of the material can be learned, or important information such as a quantum dot size, a carrier transmission path and a service life, etc. of the material can be learned. Regarding the quantum dot material, the photoluminescence analysis may measure a quantum dot shape, a quantum dot size, an optical energy value of electrons in energy level transition, various reliabilities, etc., so that the photoluminescence analysis can be used as an evaluation tool for quantum dots.

Regardless of an excitation source, once the electrons of the excited atoms are excited, the electrons may release an energy difference between the energy levels in form of lighting when the electrons fall from a high energy excitation state to a low energy ground state. When an emission spectrum of the quantum dot is analyzed, following parameters are noted: (1) a wavelength and a strength thereof corresponding to a peak of an emission spectrum; (2) a wavelength corresponding to two sides of a half peak width; (3) full width at half maximum (FWHM).

In an embodiment of the invention, when the light-emitting material 100 is irradiated by a light with a wavelength greater than 350 nm and smaller than a light-emitting wavelength, for example, a light with a wavelength of 390 nm to 500 nm, the light emitting material 100, for example, emits a light with a peak wavelength of 400 nm to 700 nm, and the FWHM of the light is for example, 15 nm to 60 nm or 20 nm to 60 nm.

In an embodiment of the invention, when the light-emitting material 100 is irradiated by a light with a wavelength greater than 350 nm and smaller than a light-emitting wavelength, for example, a light with a wavelength of 390 nm to 500 nm, the quantum dots 110, for example, emit a light with a peak wavelength of 400 nm to 700 nm, and the FWHM of the light is for example, 15 nm to 60 nm or 20 nm to 60 nm. In an embodiment of the invention, a peak wavelength of the light emitted by the red light quantum dots is, for example, 600 nm to 700 nm, or 605 nm to 680 nm, or 610 nm to 660 nm, and the FWHM of the light is for example, 15 nm to 60 nm or 20 nm to 60 nm. In an embodiment of the invention, a peak wavelength of the light emitted by the green light quantum dots is, for example, 500 nm to 600 nm, or 510 nm to 560 nm, or 520 nm to 550 nm, and the FWHM of the light is for example, 15 nm to 60 nm or 20 nm to 60 nm. In an embodiment of the invention, a peak wavelength of the light emitted by the blue light quantum dots is, for example, 400 nm to 500 nm, or 430 nm to 470 nm, or 440 nm to 460 nm, and the FWHM of the light is for example, 15 nm to 60 nm or 20 nm to 60 nm. The peak wavelength, the intensity and the FWHM of the light emitted by the quantum dots are, for example, obtained by a steady state fluorescence spectrometer (model No. FLmax-3) manufactured by Horiba company by performing the photoluminescence analysis.

In an embodiment of the invention, a weight percentage of the quantum dots 110 in the light-emitting material can be 0.1% to 30%. The light-emitting material 100 formed based on the weight percentage of such range has a stable light-emitting effect. The weight percentage of the quantum dots 110 in the light-emitting material refers to a percentage of a weight of the quantum dots 110 relative to a weight of the entire light-emitting material 100. Moreover, the weight percentage of the quantum dots 110 can also be 0.2% to 25%, or 0.3% to 20%. When the weight percentage of the quantum dots 110 is lower than 0.1%, a concentration of the quantum dots 110 in the light-emitting material 100 is relatively low, and the whole light-emitting efficiency is not good. When the weight percentage of the quantum dots 110 is higher than 30%, the quantum dots 110 may have a phenomenon of self absorption, such that the whole light-emitting efficiency is decreased, and the emitted light may have a red shift. The weight percentage can be obtained by means of necessary analysis, for example, an inductively coupled plasma (ICP) spectrum analysis method, etc.

Referring to FIG. 1, each particle of the light-emitting material 100 of the present embodiment includes a core 120, a package layer 130 and quantum dots 110. The package layer 130 wraps the core 120. The quantum dots 110 are disposed between the core 120 and the package layer 130. In other words, a thickness D20 of the package layer 130 substantially determines the minimum distance D10 between the outermost quantum dots 110 of the particle and the surface S10 of the particle. The thickness D20 of the package layer 130 is, for example, 0.1 nm to 20 nm.

A material of the core 120 of the present embodiment can be material selected from the group consisting of organic polymers, inorganic polymers, water-soluble polymers, organic solvent-soluble polymers, biopolymers and synthetic polymers, for example, selected from the group consisting of polysiloxane, silica, polyacrylate, polycarbonate, polystyrene, polyethylene, polypropylene, polyketone, polyether ether ketone, polyester, polyamide, polyimide, polyacrylamide, polyolefin, polyacetylene, polyisoprene, polybutadiene, poly(vinylidene fluoride), poly(vinyl chloride), ethylene vinyl acetate, polyethylene terephthalate, polyurethane and cellulose polymer. The material of the core 120 of the present embodiment can also be an inorganic medium, for example, material selected from the group consisting of silica, bentonite, glass, quartz, kaolin, silicon dioxide, aluminium oxide and zinc oxide. The package layer 130 of the present may have a material the same or different to that of the core 120. The material of the core 120 of the present embodiment is preferably silicon oxide, for example, material selected from the group consisting of polysiloxane, glass, water glass and silicon dioxide.

The material of the package layer 130 of the present embodiment can be material selected from the group consisting of organic polymers, inorganic polymers, water-soluble polymers, organic solvent-soluble polymers, biopolymers and synthetic polymers, for example, selected from the group consisting of polysiloxane, silica, polyacrylate, polycarbonate, polystyrene, polyethylene, polypropylene, polyketone, polyether ether ketone, polyester, polyamide, polyimide, polyacrylamide, polyolefin, polyacetylene, polyisoprene, polybutadiene, poly(vinylidene fluoride), poly(vinyl chloride), ethylene vinyl acetate, polyethylene terephthalate, polyurethane and cellulose polymer. The material of the package layer 130 of the present embodiment can also be an inorganic medium, for example, material selected from the group consisting of silica, bentonite, glass, quartz, kaolin, silicon dioxide, aluminium oxide and zinc oxide. The material of the package layer 130 of the present embodiment is preferably silicon oxide, for example, material selected from the group consisting of polysiloxane, glass, water glass and silicon dioxide.

The water glass is a material combined with alkali metal oxide and silicon dioxide, and can be divided into lithium water glass, sodium silicate and potassium water glass according to the types of the alkali metal, and molecular formulas thereof are respectively $Li_2O \cdot nSiO_2$, $Na_2O \cdot nSiO_2$ and $K_2O \cdot nSiO_2$, in which a coefficient n is referred to as a water glass modulus, which is a molecular ratio (or mole ratio) between the silicon oxide and the alkali metal oxide in the water glass, where n is between 1.5-4.0, and is preferably between 2.0-3.5. The water glass of the present embodiment can be at least one selected from the group consisting of the lithium water glass, sodium silicate and potassium water glass, though the invention is not limited thereto. In the present embodiment, the water glass is preferably the potassium water glass.

Polysiloxane is obtained through a hydrolysis and condensation reaction occurred by adding water to a siloxane compound shown in a following equation (I):

$$R^a_n Si(OR^b)_{4-n}\ n=0\sim3 \qquad \text{Equation (I);}$$

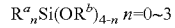

Where, $R^a$ represents an aromatic base with a carbon number of 6-15, $R^b$ represents an alkyl group with a carbon number of 1-5. In the present embodiment, the siloxane compound includes, in a definition of $R^a$, the aromatic base is, but not limited to, phenyl, tolyl, p-hydroxyphenyl, 1-(p-hydroxyphenyl)ethyl, 2-(p-hydroxyphenyl)ethyl, 4-hydroxyl-5-(p-hydroxyphenylcarbonyloxy)pentyl or naphthyl. In the definition of $R^a$, the alkyl is, but not limited to, methyl, ethyl, n-propyl, isopropyl or n-butyl. In the present embodiment, the polysiloxane is preferably obtained through the hydrolysis and condensation reaction occurred by adding water to tetraethoxysilane.

An average particle size of the core 120 of the present embodiment is, for example, 0.1 μm to 25 μm, or 0.3 μm to 15 μm, or 0.5 μm to 10 μm. The material of the core 120 of the present embodiment is porous, and a surface mean aperture of the core 120 is 3 nm to 100 nm. When the core 120 is porous, it avails evenly and stably absorbing the quantum dots 110 on the core 120. In an embodiment, when the quantum dots 110 are the red light quantum dots, the surface mean aperture of the core 120 is, for example, 7 nm to 40 nm, or 7 nm to 35 nm, or 7 nm to 30 nm. When the quantum dots 110 are the green light quantum dots, the surface mean aperture of the core 120 is, for example, 5 nm to 30 nm, or 5 nm to 25 nm, or 5 nm to 20 nm. When the quantum dots 110 are the blue light quantum dots, the surface mean aperture of the core 120 is, for example, 3 nm to 25 nm, or 3 nm to 20 nm, or 3 nm to 15 nm. The specific surface area of the core 120 is, for example, 100 m²/g to 1000 m²/g. In an embodiment of the invention, porous micron particles are taken as the cores of the invention. The porous micron particles can be silicon dioxide particles. The core may have a property of lipophilicity, and the porous micron particles can be lipophilic silicon dioxide particles. The lipophilic cores can be obtained by reforming the core of the lipophilic silicon dioxide particles through a silane compound shown in a following equation (II):

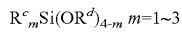   Equation (II);

Where $R^c$ represents an alkyl group with a carbon number of 3-20, and $R^d$ represents an alkyl group with a carbon number of 1-15. In the present embodiment, $R^c$ is, for example, but not limited to, octyl, nonyl, or decyl; and $R^d$ is, for example, but not limited to, methyl, ethyl, n-propyl, isopropyl or n-butyl.

Taking the porous core 120 made of silicon dioxide as an example, it can be a porous core with an average particle diameter of 1-5 μm, a surface mean aperture of 5-15 nm, and a specific surface area of 500-900 m²/g; or the core 120 can be a porous core with the average particle diameter of 1-5 μm, the surface mean aperture of 10-30 nm, and the specific surface area of 250-750 m²/g; or the core 120 can be a porous core with the average particle diameter of 0.5-1.5 μm, the surface mean aperture of 5-15 nm, and the specific surface area of 200-600 m²/g; or the core 120 can be a porous core with the average particle diameter of 0.1-0.5 μm, the surface mean aperture of 3-12 nm, and the specific surface area of 100-500 m²/g.

In the present embodiment, after a high temperature test of 250° C. is performed to the light-emitting material of the invention for 2 hours, a retention ratio of a photoluminescence (PL) measurement intensity is 50-75% relative to the PL measurement intensity before the high temperature test. On the other hand, a retention ratio of light-emitting efficiency of the conventional unprocessed (core adsorption, package) quantum dot material after the same high temperature test is only 2%. Therefore, the structure of the light-emitting material of the invention avails improving high temperature resistance capability of the quantum dots.

According to the above description, it is known that the light-emitting material of the present embodiment includes the quantum dots incorporated into an optical transparent medium (for example, silicon dioxide). The light-emitting material can be applied to a light-emitting diode (LED) package material (for example, epoxy resin, polysiloxane resin, acrylate resin, glass, etc.). The quantum dots in the optical transparent medium are optically connected to a solid state/primary light source (for example, a LED, a laser light source, an arc light and a blackbody light source, etc.), such that when the light-emitting material is excited by the light coming from the primary light source, the quantum dots in the light-emitting material may emit a secondary light with a desired color. Moreover, a required intensity and wavelength of the light emitted by the whole device can be satisfied by properly mixing the color of the primary light and the color of the secondary light produced by the quantum dots through frequency down-conversion of the primary light. Moreover, a size, a shape and a composition of the optical transparent medium can be controller, or the size and the number of the quantum dots of each type in the optical transparent medium can be controlled to make the light emitted by the light-emitting material containing the quantum dots to produce a light with any specific color and intensity after subsequent light mixing. The LEDs using of the light-emitting material of the present embodiment may serve as a backlight unit or a light-emitting assembly of other light-emitting device, or a plurality of LEDs are arranged in an array to serve as a quantum dot LED (QLED) display equipment, i.e. each of the LEDs is a pixel.

Figure 5A:
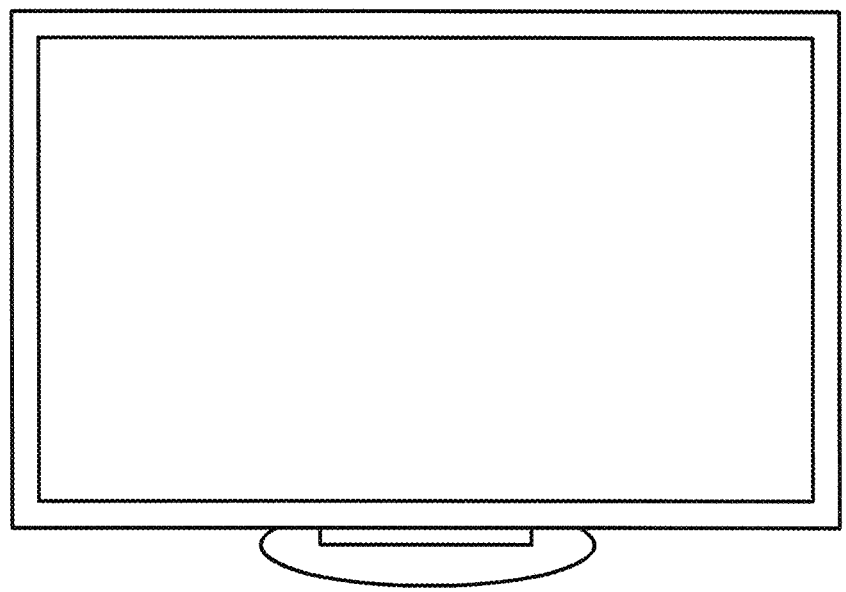
FIG. 5A to FIG. 5J are schematic diagrams of display apparatuses according to a plurality of embodiments of the invention.
Figure 5B:
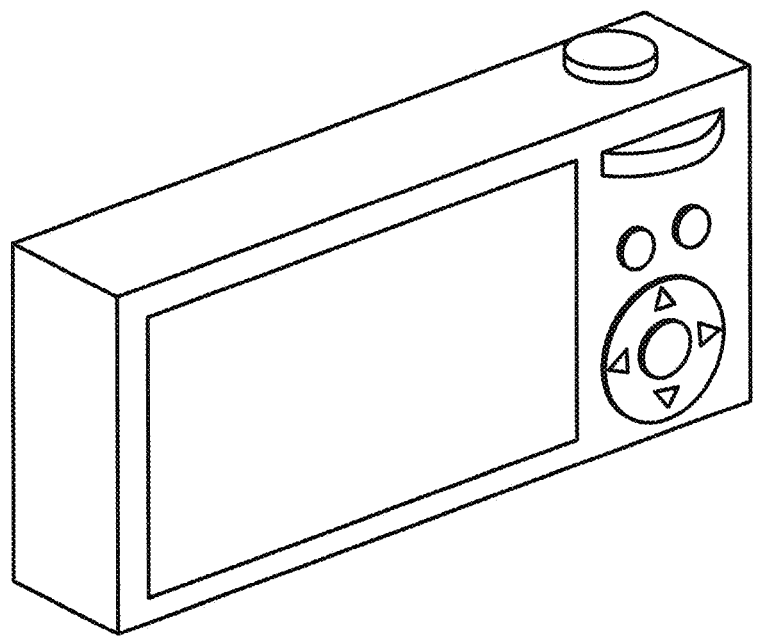
Figure 5C:
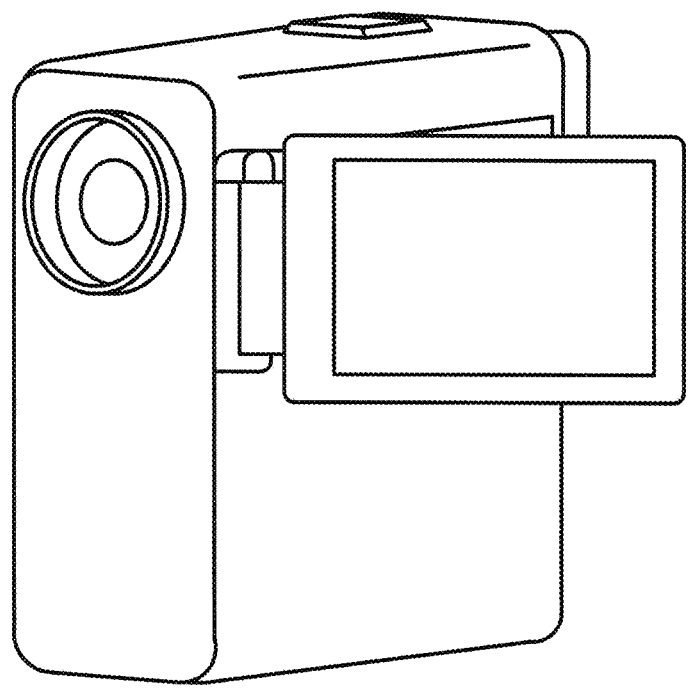
Figure 5D:
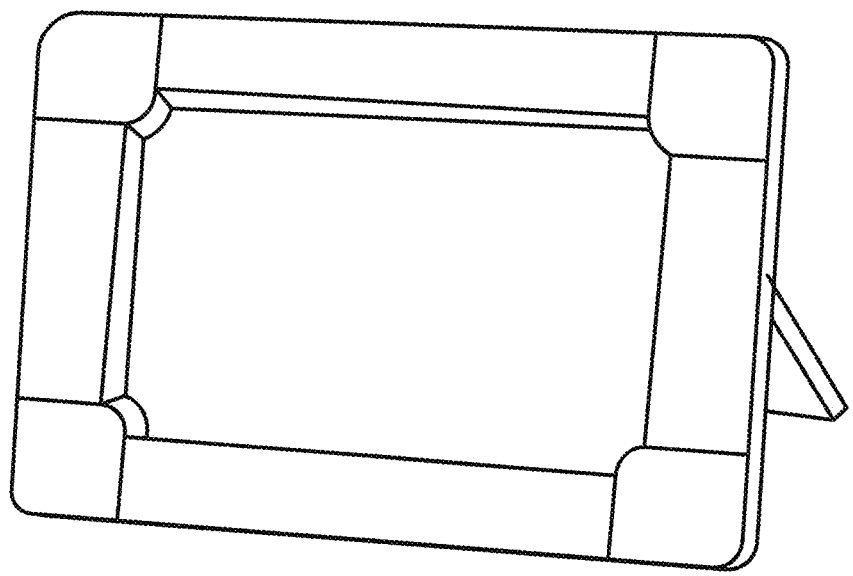
Figure 5E:
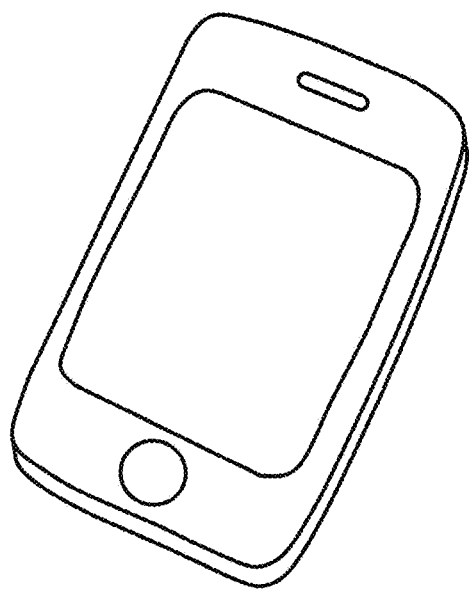
Figure 5F:
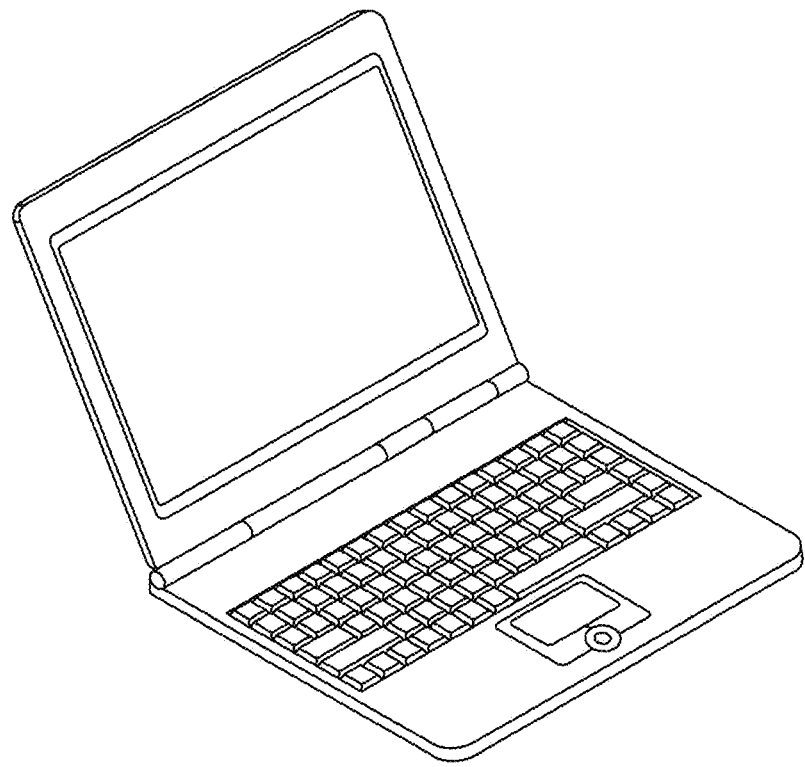
Figure 5G:
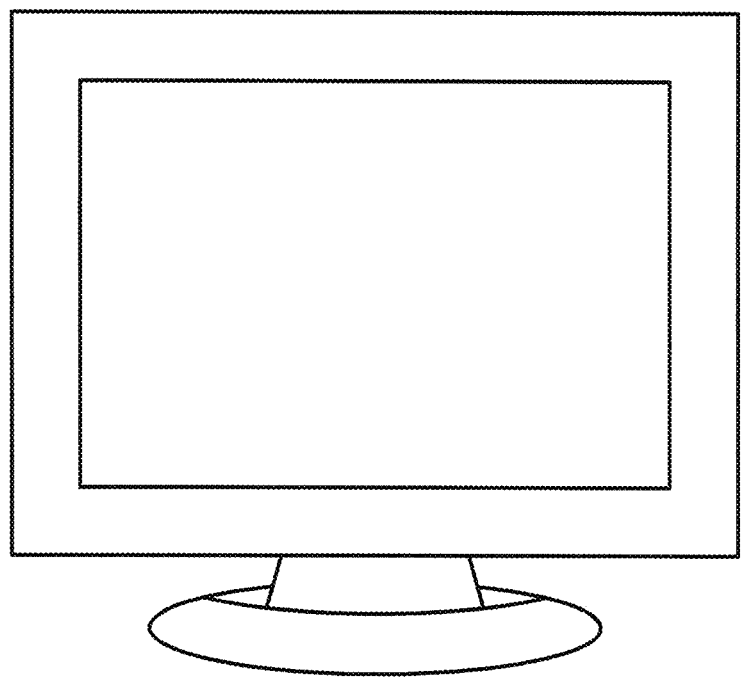
Figure 5H:
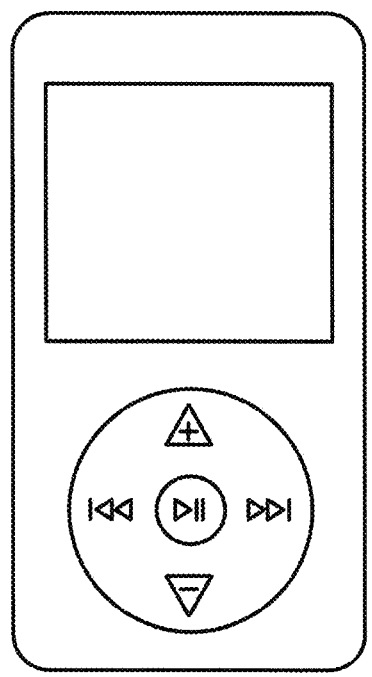
Figure 5I:
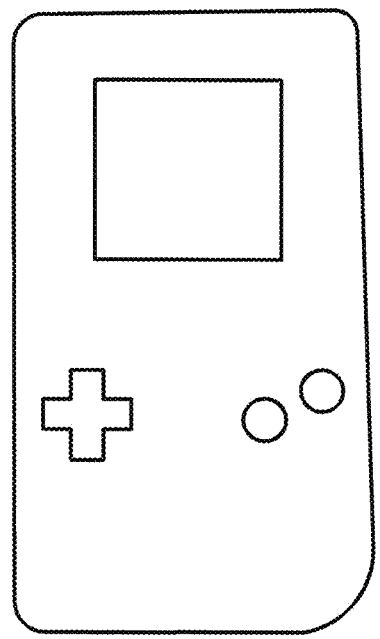
Figure 5J:
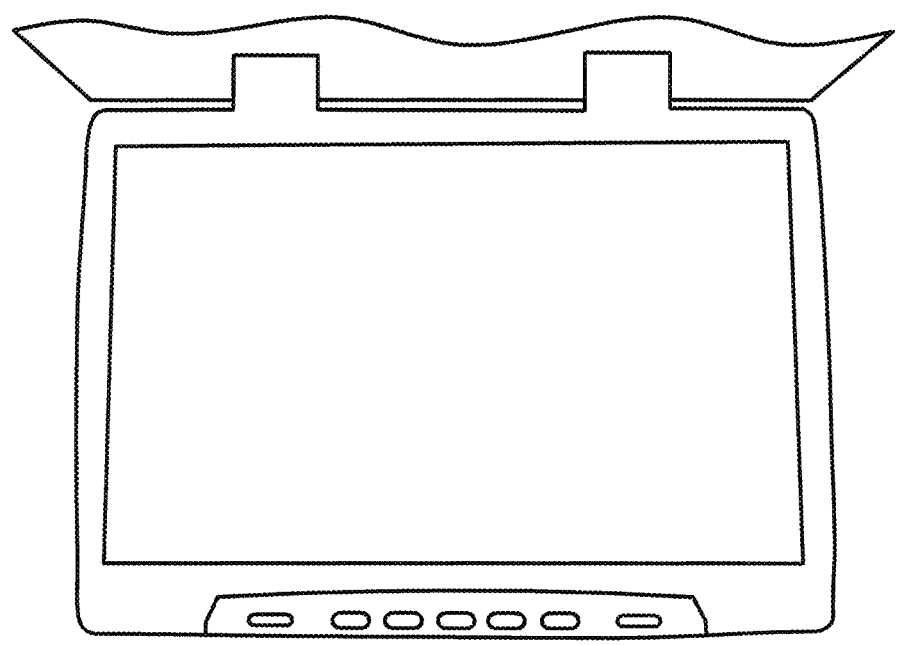

The light-emitting material of the invention can be applied to various display apparatuses. The display apparatus can be a television (which is also referred to as a TV, or a TV receiver) (referring to FIG. 5A), a digital camera (referring to FIG. 5B), a digital video camera (referring to FIG. 5C), a digital photo frame (referring to FIG. 5D), a mobile phone (referring to FIG. 5E), a notebook computer (referring to FIG. 5F), a mobile computer, a monitor adapted to a computer, etc. (referring to FIG. 5G), a portable game machine, a portable information terminal, an audio reproduction device (referring to FIG. 5H), a game machine (referring to FIG. 5I) and a vehicle display (referring to FIG. 5J).

It should be noted that the light-emitting material of the invention is not limited to be applied to the LED package material, but can also be applied to an optical film, an optical plate, a transparent tube, an optical component, a backlight unit, a light-emitting device, a color conversion material, an optical material, an ink, a label agent, etc., and all of the light emitted therefrom can be effectively consisted of only the light emitted by the quantum dots (i.e. only the secondary light), or consisted of the light emitted by the quantum dots and the light emitted by the solid state/primary light source (i.e. the primary light and the secondary light). In an embodiment, the light-emitting material may contain one or a plurality of types of the quantum dots used for emitting lights of different colors.

Figure 2:
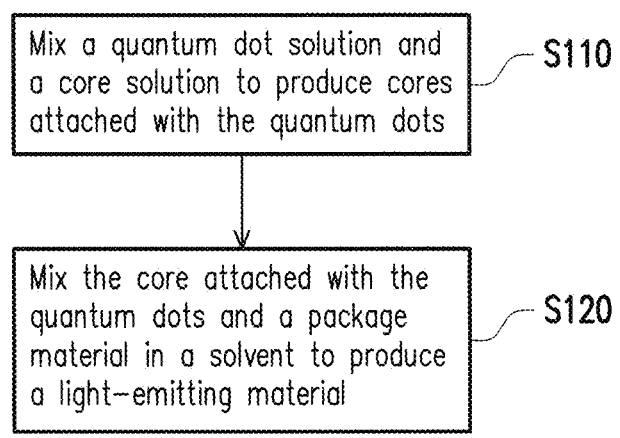
FIG. 2 is a flowchart illustrating a method for producing a light-emitting material according to an embodiment of the invention.

FIG. 2 is a flowchart illustrating a method for producing the light-emitting material according to an embodiment of the invention. Referring to FIG. 2, the method for producing the light-emitting material of the present embodiment includes following steps. In step S110, a quantum dot solution and a core solution are mixed to produce cores attached with the quantum dots. In step S120, the core attached with the quantum dots and a package material are mixed in a solvent to produce the light-emitting material. Each particle of the light-emitting material produced according to the aforementioned method is substantially the same with the particle of the light-emitting material of FIG. 1.

To be specific, in the step S110, the solution evenly distributed with the quantum dots and the solution evenly distributed with the cores are mixed to form the cores attached with the quantum dots. In the step S120, the cores attached with the quantum dots that are obtained in the aforementioned step and the package material are mixed in the solvent, such that a package layer formed by the package material wraps the cores attached with the quantum dots through a physical and/or chemical change. By properly adjusting a proportion of the cores and the quantum dots, and through a combination of physical and chemical features of a solution system (for example a proportion, a temperature change, a material feature and a solvent selection), the quantum dots can be evenly and effectively adsorbed on the cores. Similarly, by properly adjusting a proportion of the core attached with the quantum dots and the package material, and through a combination of physical and chemical features of a solution system (for example, a proportion, a temperature change, a material feature and a solvent selection), the quantum dots can be nicely protected by the package layer.

The quantum dot solution in the step S110 of the present embodiment is a solution formed by mixing the quantum dots with n-hexane. A weight percentage of the quantum dots in the quantum dot solution is 0.1% to 5%. The core solution in the step S110 of the present embodiment is a solution formed by mixing the cores with the n-hexane. A weight percentage of the cores in the core solution is 0.5% to 10%. In the step S110 of the present embodiment, the step of producing the core attached with the quantum dots includes centrifugal filtration after standing. In the step S120 of the present embodiment, the step of mixing the cores attached with the quantum dots and the package material in the solvent to produce the light-emitting material includes: adding tetraethoxysilane and $NH_4OH$ to the ethanol added with the cores attached with the quantum dots, and sequentially performing centrifugal separation, cleaning, centrifugal separation and drying after stirring the solution at a room temperature.

Quantum Dot Solution Synthesis Example 1

Cadmium oxide (CdO) of 340 mg and oleic acid of 4500 mg are added in a three-necked flask. Then, octadecene (ODE) of 15 ml is added, and the solution is heated and reacted to mix in a vacuum environment under a temperature of 180° C. Then, nitrogen is filled in the three-necked flask, and the temperature is elevated to 250° C. Then, TOPSe of 0.3 ml, 0.2 mmol is injected and the solution is heated under the temperature of 250° C. Then, the solution is stirred to produce an orange suspension liquid, and then the suspension liquid is cooled down and the reactant is washed by using methanol. Finally, acetone is used to precipitate and separate a suspended substance, and dissolve the same in n-hexane, such that an n-hexane solution with a material of CdSe nanocompound is obtained. Then, trioctylphosphine (TOP) of 1600 mg and sulphur (S) of 64 mg are added to the three-necked flask, and zinc acetate (ZnAc) of 300 ml is added therein, and the solution is heated and reacted to mix in a vacuum environment under a temperature of 120° C. Then, CdSe nanoparticles of 80 mg are added to react under the temperature of 120° C. Then, a mixture obtained after the above reaction is cooled down to 60° C., and ethanol of 300 ml is adopted for precipitation. The obtained precipitate is red quantum dots after centrifugal separation, and a peak wavelength of the emitted light is 630 nm, and the FWHM thereof is 30 nm.

Quantum Dot Solution Synthesis Example 2

CdO of 260 mg, zinc acetate of 7020 mg, and oleic acid of 45 mg are added in a three-necked flask. Then, ODE of 140 ml is added, and the solution is heated and reacted to mix in the vacuum environment under a temperature of 120° C. Then, nitrogen is filled in the three-necked flask, and the temperature is elevated to 250° C. Then, TOPSe of 20 ml, 0.025 mmol and sulphur of 1080 mg are injected and the solution is heated under the temperature of 250° C. Then, the solution is stirred to produce a yellow green suspension liquid, and then the suspension liquid is cooled down and ethanol of 300 ml is adopted for precipitation. The obtained precipitate is green quantum dots after centrifugal separation, and a peak wavelength of the emitted light is 530 nm, and the FWHM thereof is 40 nm.

Producing of the Quantum Dot Solution

The red quantum dots of the quantum dot solution synthesis example 1 removed with the solvent are mixed with the n-hexane to produce a red quantum dot n-hexane solution with a weight percentage of the quantum dots of 1%, so as to obtain a quantum dot solution (1).

The green quantum dots of the quantum dot solution synthesis example 2 removed with the solvent are mixed with the n-hexane to produce a green quantum dot n-hexane solution with a weight percentage of the quantum dots of 1%, so as to obtain a quantum dot solution (2).

Producing of the Core Solution

The porous micron particles that take lipophilic silicon dioxide particles with an average diameter of 3 µm, a surface mean aperture of 10 nm, and a specific surface area of 700 $m^2/g$ as cores are mixed with n-hexane to produce a porous micron particle n-hexane solution with a weight percentage of the porous micron particles of 5%, so as to obtain a core solution (3).

The porous micron particles that take lipophilic silicon dioxide particles with the average diameter of 1 µm, the surface mean aperture of 10 nm, and the specific surface area of 400 $m^2/g$ as cores are mixed with n-hexane to produce a porous micron particle n-hexane solution with a weight percentage of the porous micron particles of 5%, so as to obtain a core solution (4).

The porous micron particles that take lipophilic silicon dioxide particles with the average diameter of 3 µm, the surface mean aperture of 16 nm, and the specific surface area of 500 $m^2/g$ as cores are mixed with n-hexane to produce a porous micron particle n-hexane solution with a weight percentage of the porous micron particles of 5%, so as to obtain a core solution (5).

The porous micron particles that take lipophilic silicon dioxide particles with the average diameter of 0.15 µm, the surface mean aperture of 5 nm, and the specific surface area of 120 $m^2/g$ as cores are mixed with n-hexane to produce a porous micron particle n-hexane solution with a weight percentage of the porous micron particles of 5%, so as to obtain a core solution (6).

The porous micron particles that take lipophilic silicon dioxide particles with the average diameter of 50 µm, the surface mean aperture of 12 nm, and the specific surface area of 120 $m^2/g$ as cores are mixed with n-hexane to produce a porous micron particle n-hexane solution with a weight percentage of the porous micron particles of 5%, so as to obtain a core solution (7).

The micron particles that take lipophilic silicon dioxide particles with the average diameter of 3 µm and non-micropore as cores are mixed with n-hexane to produce a micron particle n-hexane solution with a weight percentage of the micron particles of 5%, so as to obtain a core solution (8).

Embodiment 1

Figure 3:
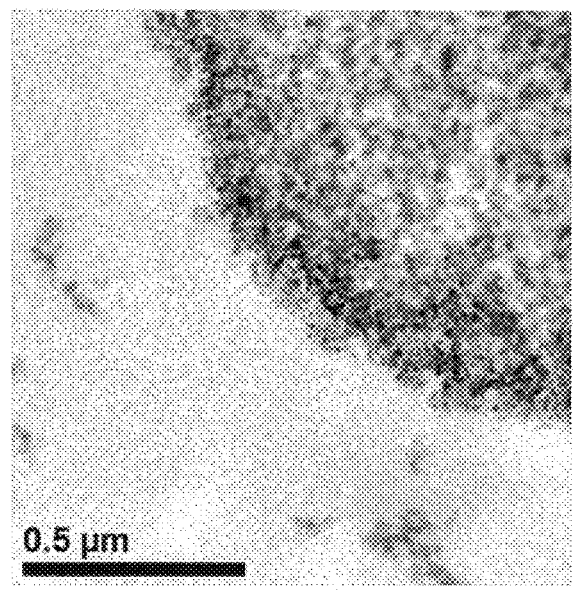
FIG. 3 and FIG. 4 are pictures of the light-emitting material after embedding and sectioning observed through a transmission electron microscopy.
Figure 4:
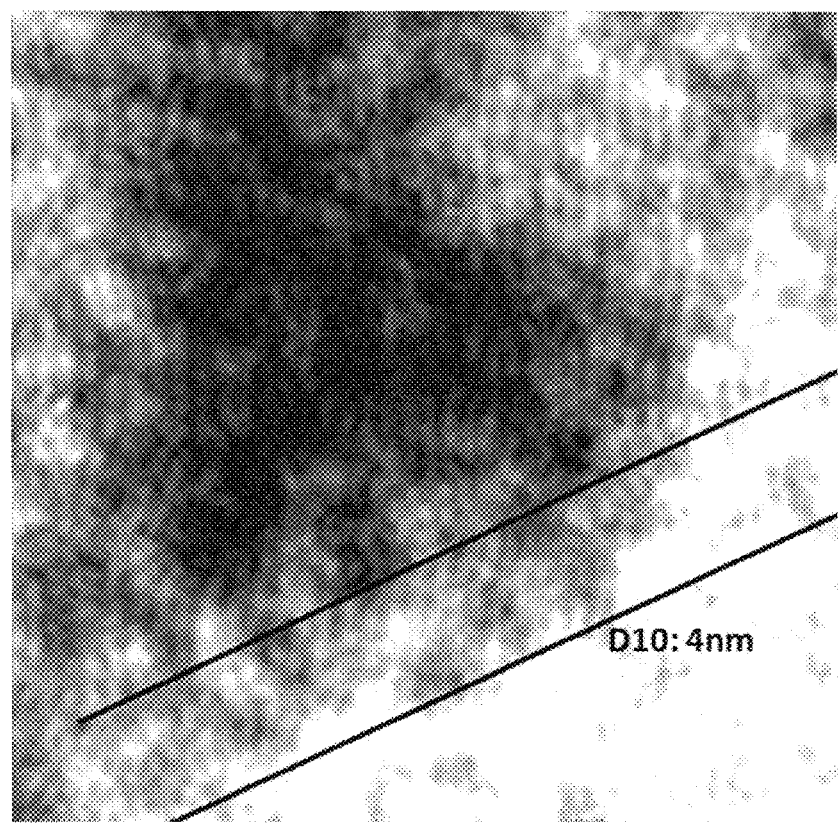

The aforementioned quantum dot solution (1) of 0.25 g and the aforementioned core solution (3) of 5 g are mixed, and the mixture is made to stand for 10 minutes. Then, porous micron particles containing the quantum dots (i.e. the cores attached with the quantum dots) are obtained after centrifugal filtration. Then, the porous micron particles containing the quantum dots are added to ethanol of 250 g and are evenly dispersed. Then, tetraethoxysilane (TEOS) of 0.5 g and $NH_4OH$ with a weight percentage of 29% of 2.5 g are added, and the solution is stirred for 4 hours at the room temperature, and now a pH value thereof is 10-11. Then, centrifugal separation is performed, and then the leftover is cleaned by pure water for three times, and then a drying process is performed to obtain the micron level light-emitting material of 0.2778 g. After embedding and sectioning, the light-emitting material can be observed and measured (shown in FIG. 3 and FIG. 4) by using a transmission electron microscopy. Moreover, photoluminescence analysis can be adopted to measure an intensity of a peak of the light-emitting material, and a result thereof is shown in a table 2.

Embodiments 2-7

The embodiments 2-7 are the same to the embodiment 1, and material usage amounts and stir time can be obtained by referring the table 1.

Embodiments 8

Referring to the table 1 for the material usage amounts and the stir time, and except that a tetraethoxysilane package step is performed twice, the other steps of the embodiment 8 are the same to the embodiment 1. In detail, the porous micron particles containing the quantum dots are added to ethanol of 250 g and are evenly dispersed. Then, TEOS of 2.5 g and $NH_4OH$ with a weight percentage of 29% of 2.5 g are added, and the solution is stirred for 8 hours at the room temperature, and now a pH value thereof is 10-11. Then, centrifugal separation is performed, and the leftover is added to ethanol of 250 g and is evenly dispersed, and TEOS of 2.5 g and $NH_4OH$ with the weight percentage of 29% of 2.5 g are added, and the solution is stirred for 8 hours at the room temperature, and is then cleaned by pure water for three times, and then a drying process is performed to obtain the micron level light-emitting material of 0.6757 g.

Embodiments 9-13

The embodiments 6-13 are the same to the embodiment 1, and material usage amounts and stir time can be obtained by referring the table 1.

Embodiments 14

The aforementioned quantum dot solution (2) of 1.25 g and the aforementioned core solution (4) of 5 g are mixed, and the mixture is made to stand for 10 minutes. Then, porous micron particles containing the quantum dots (i.e. the cores attached with the quantum dots) are obtained after centrifugal filtration. Then, the porous micron particles containing the quantum dots are added to ethanol of 250 g and are evenly dispersed. Then, tetraethoxysilane (TEOS) of 0.5 g, potassium water glass aqueous solution with a weight percentage of 29% of 0.5 g ($SiO_2:K_2O=2.5:1$ w/w; $K_2O \cdot nSiO_2$, n=2.54) and $NH_4OH$ with a weight percentage of 29% of 2.5 g are added, and the solution is stirred for 4 hours at the room temperature, and now a pH value thereof is 10-11. Then, centrifugal separation is performed, and then the leftover is cleaned by pure water for three times, and then a drying process is performed to obtain the micron level light-emitting material of 0.3289 g.

Embodiments 15-16

The embodiments 15-16 are the same to the embodiment 14, and material usage amounts and stir time can be obtained by referring the table 1.

Comparison Example

A light-emitting material obtained by removing solvent from the aforementioned quantum dot solution (1) of 0.25 g

TABLE 1

| | Quantum dot solution (g) | | Core solution (g) | | | | | | Silicon oxide (g) | | Stir time (hour) |
|---|---|---|---|---|---|---|---|---|---|---|---|
| | 1 | 2 | 3 | 4 | 5 | 6 | 7 | 8 | TEOS | Potassium water glass | |
| Embodiment 1 | 0.25 | 0 | 5 | 0 | 0 | 0 | 0 | 0 | 0.5 | 0 | 4 |
| Embodiment 2 | 0.025 | 0 | 5 | 0 | 0 | 0 | 0 | 0 | 0.5 | 0 | 4 |
| Embodiment 3 | 2.5 | 0 | 5 | 0 | 0 | 0 | 0 | 0 | 0.5 | 0 | 4 |
| Embodiment 4 | 5 | 0 | 5 | 0 | 0 | 0 | 0 | 0 | 0.5 | 0 | 4 |
| Embodiment 5 | 8 | 0 | 5 | 0 | 0 | 0 | 0 | 0 | 0.5 | 0 | 4 |
| Embodiment 6 | 0.25 | 0 | 0 | 5 | 0 | 0 | 0 | 0 | 0.5 | 0 | 4 |
| Embodiment 7 | 0.25 | 0 | 0 | 5 | 0 | 0 | 0 | 0 | 2.5 | 0 | 8 |
| Embodiment 8 | 0.25 | 0 | 0 | 5 | 0 | 0 | 0 | 0 | 2.5 | 0 | 8 |
| | | | | | | | | | 2.5 | 0 | 8 |
| Embodiment 9 | 0.25 | 0 | 0 | 5 | 0 | 0 | 0 | 0 | 0 | 0 | |
| Embodiment 10 | 0.25 | 0 | 0 | 0 | 0 | 0 | 5 | 0 | 0.5 | 0 | 4 |
| Embodiment 11 | 0.25 | 0 | 0 | 0 | 0 | 0 | 0 | 5 | 0.5 | 0 | 4 |
| Embodiment 12 | 0.25 | 0 | 0 | 0 | 0 | 0 | 0 | 0 | 0.5 | 0 | 4 |
| Embodiment 13 | 0 | 1.25 | 5 | 0 | 0 | 0 | 0 | 0 | 0.5 | 0 | 4 |
| Embodiment 14 | 0 | 1.25 | 0 | 5 | 0 | 0 | 0 | 0 | 0.5 | 0.5 | 4 |
| Embodiment 15 | 0 | 1.25 | 0 | 0 | 0 | 5 | 0 | 0 | 0.5 | 0.5 | 4 |
| Embodiment 16 | 0 | 1.25 | 0 | 0 | 5 | 0 | 0 | 0 | 0.5 | 0.5 | 4 |
| Comparison example | 0.25 | 0 | 0 | 0 | 0 | 0 | 0 | 0 | 0 | 0 | 0 |

The weight percentage of the quantum dots, the particle size of the light-emitting materials, the average distance between the outermost quantum dots of the particle and the surface of the particle, and a package layer thickness of the aforementioned embodiments are shown in a following table 2.

A result of the PL measurement data and light-emitting retention ratio (%) of the aforementioned embodiments is shown in the table 2, in which $PL_{25}$ is an intensity of the PL measurement peak of the light-emitting material at a room temperature of 25° C., and $PL_{250}$ is an intensity of the PL measurement peak of the light-emitting material after a high temperature test of 250° C. for 2 hours. The light-emitting retention ratio (%) is the ratio of $PL_{250}$ to $PL_{25}$.

TABLE 2

| | Weight percentage of quantum dots (%) | Particle size of light emitting material (μm) | Minimum distance between outermost quantum dots of the particle and surface of particle (nm) | Average distance between outermost quantum dots of the particle and surface of particle (nm) | Package layer thickness (nm) | $PL_{25}$ | Light emitting retention ratio (%) |
|---|---|---|---|---|---|---|---|
| Embodiment 1 | 0.9 | 3.1 | 3.5 | 4 | 4 | $6.1 \times 10^5$ | 65 |
| Embodiment 2 | 0.08 | 3.0 | 3.5 | 4 | 4 | $4.2 \times 10^5$ | 75 |
| Embodiment 3 | 8.4 | 3.1 | 3.5 | 4 | 4 | $9.9 \times 10^5$ | 63 |
| Embodiment 4 | 16.8 | 3.0 | 4.5 | 5 | 5 | $6.6 \times 10^5$ | 60 |
| Embodiment 5 | 21.3 | 3.1 | 4.5 | 5 | 5 | $4.4 \times 10^5$ | 45 |
| Embodiment 6 | 0.83 | 1.0 | 3.5 | 4 | 4 | $6.3 \times 10^5$ | 69 |
| Embodiment 7 | 0.6 | 1.1 | 17 | 20 | 20 | $5.5 \times 10^5$ | 69 |
| Embodiment 8 | 0.37 | 1.2 | 34 | 40 | 40 | $1.8 \times 10^5$ | 67 |
| Embodiment 9 | 1 | 1.0 | — | — | — | $1.1 \times 10^6$ | 25 |
| Embodiment 10 | 0.78 | 51.3 | 3.5 | 4 | 4 | $4.6 \times 10^5$ | 39 |
| Embodiment 11 | 0.75 | 3.0 | 3.5 | 4 | 4 | $1.3 \times 10^5$ | 36 |
| Embodiment 12 | 85 | 0.027 | 9 | 10 | 10 | $5.7 \times 10^5$ | 30 |
| Embodiment 13 | 3.7 | 1.0 | 4.5 | 5 | 5 | $8.6 \times 10^5$ | 74 |
| Embodiment 14 | 3.8 | 1.1 | 7 | 8 | 8 | $8.8 \times 10^5$ | 68 |
| Embodiment 15 | 3.2 | 0.16 | 7 | 8 | 8 | $9.0 \times 10^5$ | 75 |
| Embodiment 16 | 3.5 | 3.1 | 7 | 8 | 8 | $8.3 \times 10^5$ | 63 |
| Comparison example | 100 | — | — | — | — | $1.0 \times 10^6$ | 2 |

The following phenomena can be found from the aforementioned experimental data. The light-emitting efficiency of the comparison example only having the quantum dots without the cores and the package layer is very poor, since there is no package layer for protection, and the quantum dots are easily gathered to lose the light-emitting feature. The light-emitting efficiency of the embodiment 9 only having the quantum dots and the cores without the package layer is also poor, since there is no package layer for protection. The light-emitting efficiency of the embodiment 12 only having the quantum dots and the package layer without the cores is also poor, since the quantum dots are easily gathered to lose the light-emitting feature. In view of the embodiment 11, the surface of the core has no micropore, so that the quantum dots are easily gathered, which results in a poor light-emitting efficiency. In view of the embodiment 10, the particle size of the cores is excessively large, such that a surface area used for effectively absorbing the quantum dots under a same volume is decreased, which results in a fact that the entire quantum dots are easily gathered, and the PL light-emitting intensity and the light-emitting retention ratio are all poor. In view of the embodiment 8, the package layer thickness is greater than 20 nm, and the average distance between the outermost quantum dots of the particle of light-emitting material and the surface of the particle of light-emitting material is also greater than 20 nm, which results in a fact that the number of the entire quantum dots is low, and the PL light-emitting intensity and the light-emitting retention ratio are all poor. Comparatively, the PL light-emitting intensities and the light-emitting retention ratios of light-emitting materials of the embodiments 1-7 and the embodiments 13-16 produced according to the method complied with the spirit of the invention are good.

In summary, in the light-emitting material, the method for producing the light-emitting material and the display apparatus, the quantum dots are located in internal of the light-emitting material and the light-emitting material presents a granular state, so that the quantum dots have better high-temperature reliability and maintain better light-emitting efficiency. The quantum dots naturally keep enough distance there between and are not gathered to lose the light-emitting feature. Moreover, the granular micro level quantum dots are convenient in usage compared to the nanometer level quantum dots dispersed in the solution.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A light-emitting material in a form of particles having an average particle size of 0.1 μm to 30 μm,
    wherein the light-emitting material comprises a plurality of quantum dots distributed in each of the particles of the light-emitting material,
    wherein a minimum distance between outermost quantum dots in at least one of the particles and the outermost surface of the at least one of the particles is 0.1 nm to 20 nm
    wherein each of the particles of the light-emitting material comprises:
    a core, wherein a material of the core is porous, wherein the core has lipophilicity;
    a package layer, wrapping the core; and
    the quantum dots, disposed between the core and the package layer,
    wherein when the quantum dots are red light quantum dots, a surface mean aperture of the core is 7 nm to 30 nm,
    when the quantum dots are green light quantum dots, a surface mean aperture of the core is 5 nm to 20 nm, and
    when the quantum dots are blue light quantum dots, a surface mean aperture of the core is 3 nm to 15 nm,
    wherein a weight percentage of the quantum dots is 0.3% to 20% based on a weight of the entire light-emitting material.

2. A light-emitting material in a form of particles having an average particle size of 0.1 μm to 30 μm,
wherein the light-emitting material comprises a plurality of quantum dots distributed in each of the particles of the light-emitting material,
wherein an average distance between outermost quantum dots in at least one of the particles and the outermost surface of the at least one of the particles is 0.5 nm to 25 nm,
wherein each of the particles of the light-emitting material comprises:
a core, wherein a material of the core is porous, wherein the core has lipophilicity;
a package layer, wrapping the core; and
the quantum dots, disposed between the core and the package layer,
wherein when the quantum dots are red light quantum dots, a surface mean aperture of the core is 7 nm to 30 nm,
when the quantum dots are green light quantum dots, a surface mean aperture of the core is 5 nm to 20 nm, and
when the quantum dots are blue light quantum dots, a surface mean aperture of the core is 3 nm to 15 nm,
wherein a weight percentage of the quantum dots is 0.3% to 20% based on a weight of the entire light-emitting material.

3. The light-emitting material as claimed in claim 1, wherein the quantum dots are selected from the group consisting of silicon based nanocrystals, perovskite nanocrystals, II-VI group compound semiconductor nanocrystals, III-V group compound semiconductor nanocrystals and IV-VI group compound semiconductor nanocrystals.

4. The light-emitting material as claimed in claim 2, wherein the quantum dots are selected from the group consisting of silicon based nanocrystals, perovskite nanocrystals, II-VI group compound semiconductor nanocrystals, III-V group compound semiconductor nanocrystals and IV-VI group compound semiconductor nanocrystals.

5. The light-emitting material as claimed in claim 1, wherein a specific surface area of the core is 100 $m^2/g$ to 1000 $m^2/g$.

6. The light-emitting material as claimed in claim 1, wherein a material of the package layer is selected from the group consisting of polysiloxane, glass, water glass and silicon dioxide.

7. The light-emitting material as claimed in claim 1, wherein a thickness of the package layer is 0.1 nm to 20 nm.

8. The light-emitting material as claimed in claim 1, wherein an average particle size of the core is 0.1 μm to 25 μm.

9. The light-emitting material as claimed in claim 2, wherein a specific surface area of the core is 100 $m^2/g$ to 1000 $m^2/g$.

10. The light-emitting material as claimed in claim 2, wherein a material of the package layer is selected from the group consisting of polysiloxane, glass, water glass and silicon dioxide.

11. The light-emitting material as claimed in claim 2, wherein a thickness of the package layer is 0.1 nm to 20 nm.

12. The light-emitting material as claimed in claim 2, wherein an average particle size of the core is 0.1 μm to 25 μm.

13. A display apparatus, comprising: the light-emitting material as claimed in claim 1, wherein the display apparatus is a television.

14. A display apparatus, comprising: the light-emitting material as claimed in claim 2, wherein the display apparatus is a television.

* * * * *